United States Patent
Campos et al.

(10) Patent No.: US 11,677,501 B2
(45) Date of Patent: Jun. 13, 2023

(54) INCREASED SPECTRUM EFFICIENCY IN NOMADIC OR STATIONARY MOBILITY ENVIRONMENTS

(71) Applicant: CABLE TELEVISION LABORATORIES, INC., Louisville, CO (US)

(72) Inventors: Luis Alberto Campos, Superior, CO (US); Jennifer Andreoli-Fang, Boulder, CO (US); Belal Hamzeh, Westminster, CO (US); Alireza Babaei, Westminster, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 363 days.

(21) Appl. No.: 16/148,441

(22) Filed: Oct. 1, 2018

(65) Prior Publication Data
US 2019/0037553 A1 Jan. 31, 2019

Related U.S. Application Data

(63) Continuation of application No. 14/510,864, filed on Oct. 9, 2014, now Pat. No. 10,091,769.
(Continued)

(51) Int. Cl.
*H04L 1/00* (2006.01)
*H03M 13/35* (2006.01)
(Continued)

(52) U.S. Cl.
CPC .......... *H04L 1/007* (2013.01); *H03M 13/353* (2013.01); *H04J 3/0647* (2013.01); *H04J 3/1694* (2013.01);
(Continued)

(58) Field of Classification Search
CPC ............... H04W 16/14; H04W 72/042; H04W 72/1215; H04W 24/10; H04W 56/00;
(Continued)

(56) References Cited

U.S. PATENT DOCUMENTS

| 5,517,522 A | 5/1996 | Arweiler et al. |
|---|---|---|
| 5,828,677 A | 10/1998 | Sayeed et al. |

(Continued)

OTHER PUBLICATIONS

Hu et al. "Interference avoidance for in-device coexistence in 3GPP LTE-advanced: challenges and solutions," IEEE, pp. 60-67, 2012.

*Primary Examiner* — Joseph E Avellino
*Assistant Examiner* — Mon Cheri S Davenport
(74) *Attorney, Agent, or Firm* — PdZ Patent Law, PLLC

(57) ABSTRACT

Systems and methods presented herein provide for an LTE wireless communication system operating in a Radio Frequency (RF) band with a conflicting wireless system. The LTE system includes an eNodeB operable to detect a plurality of UEs in the RF band, to generate LTE frames for downlink communications to the UEs, and to time-divide each LTE frame into a plurality of subframes. The eNodeB is also operable to condense the downlink communications into a first number of the subframes that frees data from a remaining number of the subframes in each LTE frame, and to burst-transmit the first number of the subframes of each LTE frame in the RF band.

6 Claims, 8 Drawing Sheets

Related U.S. Application Data

(60) Provisional application No. 62/030,443, filed on Jul. 29, 2014.

(51) Int. Cl.

| | | |
|---|---|---|
| *H04L 27/00* | (2006.01) | |
| *H04W 72/20* | (2023.01) | |
| *H04W 72/541* | (2023.01) | |
| *H04J 3/06* | (2006.01) | |
| *H04J 3/16* | (2006.01) | |
| *H04L 5/00* | (2006.01) | |
| *H04W 72/0446* | (2023.01) | |
| *H04W 84/12* | (2009.01) | |
| *H04W 76/10* | (2018.01) | |

(52) U.S. Cl.
CPC .......... *H04L 1/0009* (2013.01); *H04L 1/0011* (2013.01); *H04L 1/0041* (2013.01); *H04L 1/0045* (2013.01); *H04L 5/0092* (2013.01); *H04L 27/0006* (2013.01); *H04W 72/0446* (2013.01); *H04W 72/20* (2023.01); *H04W 72/541* (2023.01); *H04W 76/10* (2018.02); *H04W 84/12* (2013.01)

(58) Field of Classification Search
CPC ... H04W 72/044; H04W 16/12; H04W 48/18; H04L 5/0035; H04L 5/0096; H04L 5/1469; H04L 69/22; H04L 12/189; H04B 7/024; H04J 3/00; Y02B 60/50
See application file for complete search history.

(56) References Cited

U.S. PATENT DOCUMENTS

| | | | |
|---|---|---|---|
| 7,907,512 B1 | 3/2011 | Embse | |
| 8,423,033 B1 | 4/2013 | Everson et al. | |
| 8,908,605 B1 | 12/2014 | Oroskar | |
| 9,479,940 B2 | 10/2016 | Padden et al. | |
| 9,559,728 B2 | 1/2017 | Babaei et al. | |
| 9,730,196 B2 | 8/2017 | Hamzeh et al. | |
| 10,091,769 B2 | 10/2018 | Campos et al. | |
| 10,122,494 B2 | 11/2018 | Babaei et al. | |
| 2001/0012280 A1 | 8/2001 | Dent | |
| 2003/0135794 A1 | 7/2003 | Longwell et al. | |
| 2006/0112237 A1 | 5/2006 | Chen et al. | |
| 2006/0239230 A1 | 10/2006 | Nakano | |
| 2007/0072645 A1 | 3/2007 | Clark et al. | |
| 2007/0263587 A1 | 11/2007 | Savoor et al. | |
| 2008/0102880 A1 | 5/2008 | Gholmieh et al. | |
| 2008/0119195 A1 | 5/2008 | Hansson et al. | |
| 2008/0187059 A1 | 8/2008 | Sood | |
| 2008/0219213 A1 | 9/2008 | Natarajan et al. | |
| 2008/0298238 A1 | 12/2008 | Dawson et al. | |
| 2008/0317162 A1 | 12/2008 | Roh et al. | |
| 2009/0059856 A1 | 3/2009 | Kermoal et al. | |
| 2009/0238090 A1 | 9/2009 | Sambhwani et al. | |
| 2010/0069080 A1 | 3/2010 | Benveniste | |
| 2010/0178919 A1 | 7/2010 | Deepak et al. | |
| 2010/0220676 A1 | 9/2010 | Grandblaise et al. | |
| 2010/0248768 A1* | 9/2010 | Nakatsugawa ... | H04W 52/0225 455/73 |
| 2010/0271263 A1 | 10/2010 | Moshfeghi | |
| 2010/0329118 A1 | 12/2010 | Adams | |
| 2011/0103343 A1* | 5/2011 | Nishio ................ | H04B 7/0426 370/330 |
| 2011/0150505 A1 | 6/2011 | Roberts et al. | |
| 2011/0246862 A1 | 10/2011 | Graef | |
| 2011/0255514 A1* | 10/2011 | Olofsson .......... | H04W 72/0426 370/331 |
| 2011/0286433 A1 | 11/2011 | Xiao et al. | |
| 2012/0033645 A1 | 2/2012 | Mantravadi et al. | |
| 2012/0058742 A1 | 3/2012 | Razoumov et al. | |
| 2012/0159220 A1 | 6/2012 | Winkler et al. | |
| 2012/0164948 A1 | 6/2012 | Narasimha et al. | |
| 2012/0178483 A1 | 7/2012 | Rosenau | |
| 2012/0213116 A1 | 8/2012 | Koo et al. | |
| 2012/0238301 A1 | 9/2012 | Morrison | |
| 2013/0028201 A1 | 1/2013 | Koo et al. | |
| 2013/0083743 A1 | 4/2013 | Koo et al. | |
| 2013/0090124 A1 | 4/2013 | Panchal et al. | |
| 2013/0138826 A1 | 5/2013 | Ling et al. | |
| 2013/0148638 A1 | 6/2013 | Xing et al. | |
| 2013/0176953 A1 | 7/2013 | Stern-Berkowitz et al. | |
| 2013/0178219 A1 | 7/2013 | Lee et al. | |
| 2013/0201864 A1* | 8/2013 | Acharya ........... | H04W 72/0446 370/253 |
| 2013/0208587 A1 | 8/2013 | Bala et al. | |
| 2013/0210447 A1 | 8/2013 | Moe et al. | |
| 2013/0242907 A1 | 9/2013 | Kang et al. | |
| 2013/0265916 A1 | 10/2013 | Zhu et al. | |
| 2013/0272260 A1 | 10/2013 | Bitran et al. | |
| 2013/0273857 A1 | 10/2013 | Zhang et al. | |
| 2013/0322367 A1 | 12/2013 | Kang et al. | |
| 2014/0003239 A1 | 1/2014 | Etemad et al. | |
| 2014/0029490 A1* | 1/2014 | Kim ................... | H04L 5/1469 370/280 |
| 2014/0038657 A1 | 2/2014 | Jo et al. | |
| 2014/0045491 A1 | 2/2014 | Phan et al. | |
| 2014/0050086 A1 | 2/2014 | Himayat et al. | |
| 2014/0050206 A1* | 2/2014 | Seo .................... | H04J 11/0083 370/336 |
| 2014/0056204 A1 | 2/2014 | Suh et al. | |
| 2014/0057610 A1 | 2/2014 | Olincy et al. | |
| 2014/0080534 A1 | 3/2014 | Farhadi et al. | |
| 2014/0092765 A1 | 4/2014 | Agarwal et al. | |
| 2014/0098734 A1 | 4/2014 | Kalhan et al. | |
| 2014/0115279 A1 | 4/2014 | Chirca et al. | |
| 2014/0128088 A1 | 5/2014 | Farhadi | |
| 2014/0148165 A1 | 5/2014 | Serravalle et al. | |
| 2014/0161021 A1 | 6/2014 | Goldhamer | |
| 2014/0162659 A1 | 6/2014 | Aminaka et al. | |
| 2014/0269368 A1* | 9/2014 | Xu .................... | H04L 5/0053 370/252 |
| 2014/0269484 A1 | 9/2014 | Dankberg et al. | |
| 2014/0349704 A1 | 11/2014 | Xiao et al. | |
| 2014/0362750 A1* | 12/2014 | Song ................ | H04W 36/0072 370/311 |
| 2014/0362840 A1 | 12/2014 | Wong et al. | |
| 2014/0376483 A1 | 12/2014 | Hong et al. | |
| 2015/0003469 A1 | 1/2015 | Martinez | |
| 2015/0016441 A1 | 1/2015 | Hanson et al. | |
| 2015/0017999 A1 | 1/2015 | Chen et al. | |
| 2015/0085683 A1 | 3/2015 | Sadek et al. | |
| 2015/0146686 A1* | 5/2015 | Huang .............. | H04W 36/0072 370/331 |
| 2015/0163767 A1 | 6/2015 | Shaw et al. | |
| 2015/0188681 A1 | 7/2015 | Li et al. | |
| 2015/0208263 A1* | 7/2015 | Behravan .............. | H04L 5/0057 370/252 |
| 2015/0223069 A1 | 8/2015 | Solondz | |
| 2015/0245365 A1 | 8/2015 | Isokangas et al. | |
| 2015/0264582 A1 | 9/2015 | Brighenti et al. | |
| 2015/0271681 A1 | 9/2015 | Pérez et al. | |
| 2015/0373672 A1 | 12/2015 | Forssell | |
| 2015/0382264 A1 | 12/2015 | Cho et al. | |
| 2016/0037536 A1 | 2/2016 | Hamzeh et al. | |
| 2016/0095046 A1 | 3/2016 | Tervonen et al. | |
| 2016/0135055 A1 | 5/2016 | Bhorkar et al. | |
| 2016/0270118 A1 | 9/2016 | He et al. | |
| 2016/0295633 A1 | 10/2016 | Baligh et al. | |
| 2016/0302225 A1 | 10/2016 | Damnjanovic et al. | |
| 2017/0374612 A1 | 12/2017 | Stojanovski et al. | |
| 2018/0027444 A1 | 1/2018 | Maria | |
| 2018/0337748 A1 | 11/2018 | Hamzeh et al. | |
| 2019/0074927 A1 | 3/2019 | Babaei et al. | |

\* cited by examiner

INCREASED SPECTRUM EFFICIENCY IN NOMADIC OR STATIONARY MOBILITY ENVIRONMENTS

CROSS REFERENCE TO RELATED APPLICATIONS

This patent application is a continuation of U.S. patent application Ser. No. 14/510,864, which applications claims priority to, and thus the benefit of an earlier filing date from, U.S. Provisional Patent Application No. 62/030,443 (filed Jul. 29, 2014), the entire contents of which are hereby incorporated by reference.

BACKGROUND

Long Term Evolution (LTE) wireless communications presently operate in certain licensed bands of the Radio Frequency (RF) spectrum so as to avoid conflicts with other wireless communication systems. However, LTE can operate in virtually any portion of the RF spectrum, including certain unlicensed portions of the spectrum where WiFi communication systems operate. Due to the nature of its MAC and PHY layers, LTE poses challenges to coexistence with other radio access technologies, such as WiFi. For example, WiFi is designed to coexist with other technologies via channel sensing and random backoff. But, LTE downlink channels are designed to continuously operate at a predefined power level decided by the operator's coverage requirements, regardless of where user equipment (UE) being served is actually located. Any LTE system operating in the same band as a WiFi system would interfere with the WiFi system because the WiFi system would have little chance to sense a clear channel and deem it suitable for transmission.

SUMMARY

Systems and methods presented herein provide for an LTE wireless communication system operating in a Radio Frequency (RF) band with a conflicting wireless system. The LTE system includes an eNodeB operable to detect a plurality of UEs in the RF band, to generate LTE frames for downlink communications to the UEs, and to time-divide each LTE frame into a plurality of subframes. The eNodeB is also operable to condense the downlink communications into a first number of the subframes that frees data from a remaining number of the subframes in each LTE frame, and to burst-transmit the first number of the subframes of each LTE frame in the RF band.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

Figure 1:
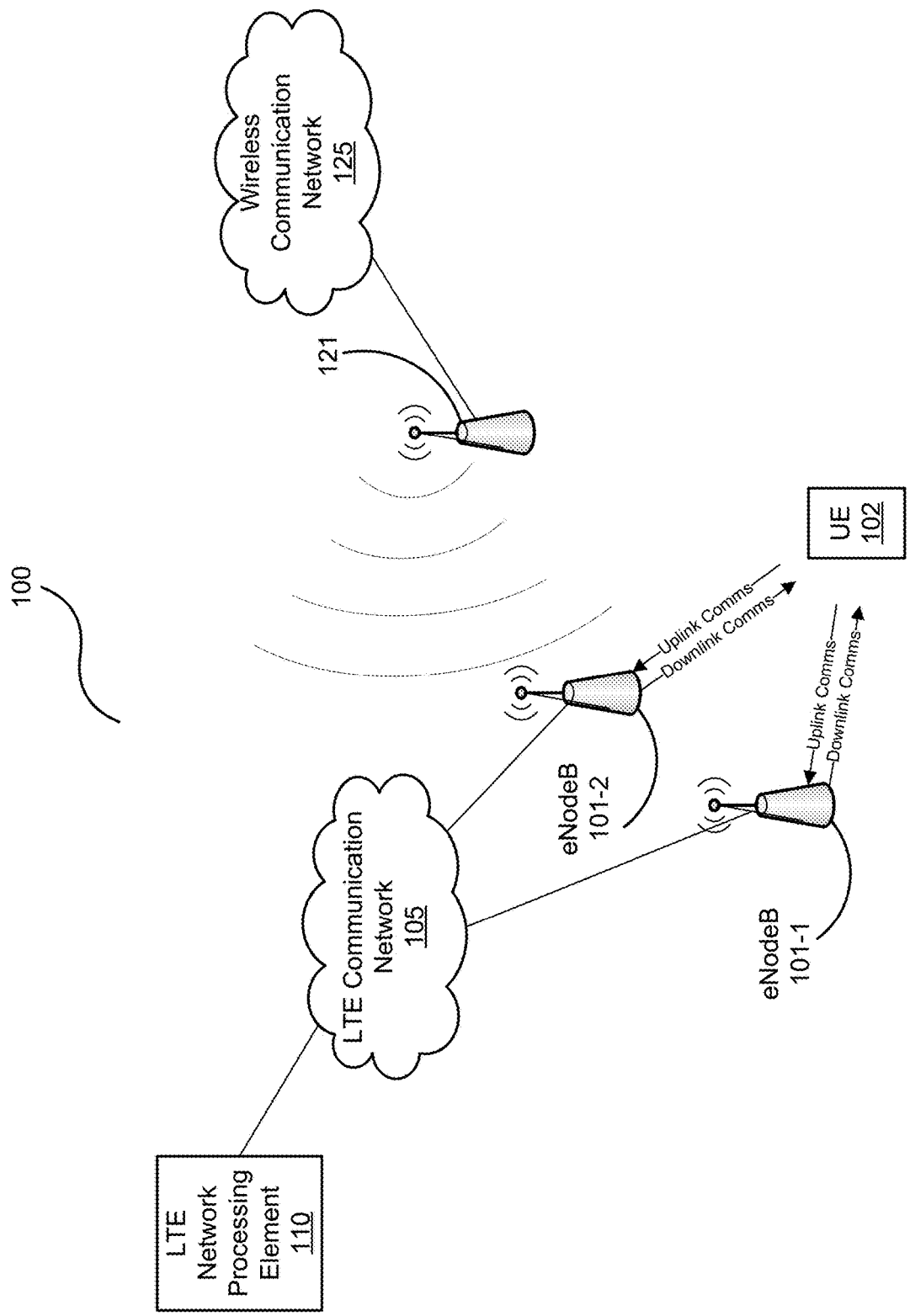
FIG. 1 is a block diagram of an exemplary LTE wireless telecommunication system operable to coexist with other communication systems.

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

In LTE, a Physical Downlink Control Channel (PDCCH) carries downlink allocation information and uplink allocation grants for a terminal. And, a Downlink Shared Channel (DL-SCH) carries Primary Synchronization Signals (PSS) and Secondary Synchronization Signals (SSS) for the UEs to discover an LTE cell. The DL-SCH elements are generally configured at the center of a channel and a Master Information Block (MIB) is transmitted therefrom. For example, in order to communicate with a network, a UE obtains basic system information, which is carried by the MIB (static) and a System Information Block (dynamic; "SIB"). The MIB carries the system information including system bandwidth, System Frame Number (SFN), and a Physical Hybrid Automatic Repeat Request (PHARQ) Indicator Channel Configuration, or PHICH.

The MIB is carried on a Broadcast Channel (BCH) and mapped into a Physical Broadcast Channel (PBCH), which is transmitted with a fixed coding and modulation scheme that can be decoded after an initial cell search procedure. With the information obtained from the MIB, UEs can decode a Control Format Indicator (CFI), which indicates the PDCCH length and allows the PDCCH to be decoded. The presence, in the PDCCH, of a Downlink Control Information (DCI) message scrambled with System Information Radio Network Temporary Identifier (SI-RNTI) indicates that an SIB is carried in the same subframe.

The SIB is transmitted in the Broadcast Control Channel (BCCH) logical channel and BCCH messages are generally carried and transmitted on the DL-SCH. Control signaling is used to support the transmission of the DL-SCH. Control information for UEs is generally contained in a DCI message transmitted through the PDCCH. The number of MNOs (again, "Mobile Network Operators"), the allocation percentage per MNO, and the expected variation in allocation generally determine optimal locations for the center of each DL-SCH, thereby limiting the probability of DL-SCH relocations.

When employing TDD in an LTE network, time coordination is used between the eNodeBs in the LTE network, including coarse time coordination, fine time coordination, and synchronized time coordination. Coarse time coordination means that at least two eNodeBs share a clock with resolution greater than a clock pulse. Fine time coordination indicates that at least two eNodeBs share a clock with resolution less than the length of a cyclic prefix. Synchronized time coordination means that sample clocks are locked between the two eNodeBs.

When employing FDD in an LTE network, frequency coordination is used to between the eNodeBs in the LTE network. Generally, frequency coordination and allocation is semi-static, real time, and/or dynamic. Semi-static spectrum allocation means that spectrum allocation is provisioned by MNO agreements and changes infrequently. Real-time spectrum allocation means that spectrum allocation between MNOs that can vary dynamically based on resource needs and scheduler capability. Allocations are flexible within bounds that are configured by agreement between MNOs. Dynamic scheduling means channel time allocations that are variably sized for each MNO.

Generally, in LTE DLs, two synchronization signals are transmitted in six center Resource Blocks (RBs), including a Primary Sync Signal (PSS) and a Secondary Synchronization Signal (SSS). Information about system bandwidth is contained in the MIB and is expressed as some number of kHz above or below the center frequency. When a UE initially comes online, it finds the PSS/SSS and then the MIB.

Turning now to FIG. 1, an exemplary LTE wireless telecommunication system 100 is illustrated. In this embodiment, the LTE system 100 is operable to alter communication strategies to avoid interference with other conflicting wireless communication systems, such as wireless communication network 125 and the wireless transceiver 121, operating in the same RF band as the LTE system 100. One example of a conflicting wireless communication system operating in the same RF band as the LTE system 100 includes a WiFi network. Although shown with two base stations, or "eNodeBs", 101-1 and 101-2 (i.e., for the sake of simplicity), the LTE system 100 typically comprises a plurality of eNodeBs 101 that are operable to transmit to a plurality of subscriber UEs 102 through downlink communications and to receive uplink communications from the UEs 102. The uplink and downlink communications can be processed in a variety of ways as a matter design choice (e.g., at the eNodeB 101, back office processing of a Mobile Communications Operator—"MCO", Virtual Radio Access Networks—"VRANs", etc.). Accordingly, the base station 101 may be implemented based on the type of uplink and downlink communication processing being employed (e.g., VRANs use base stations that are for the most part antennas and transceivers that do not perform call processing).

In whatever form, an LTE network processing element 110, being part of the LTE communication network 105, alters its communications so as to avoid interference from another communication system operating in the same RF band. More particularly, the LTE network processing element 110 changes the manner in which the control channel is transmitted from the eNodeBs 101. Thus, the LTE network processing element 110 is any system, device, software, or combination thereof operable to direct the eNodeBs 101 to burst-transmit signaling to the UEs 102 and allow communications from other wireless systems between bursts. Examples of the UE 102 include cell phones, table computers, laptop computers, and the like. The LTE system 100 of FIG. 1 will now be shown and described with respect to one exemplary process in FIG. 2.

Figure 2:
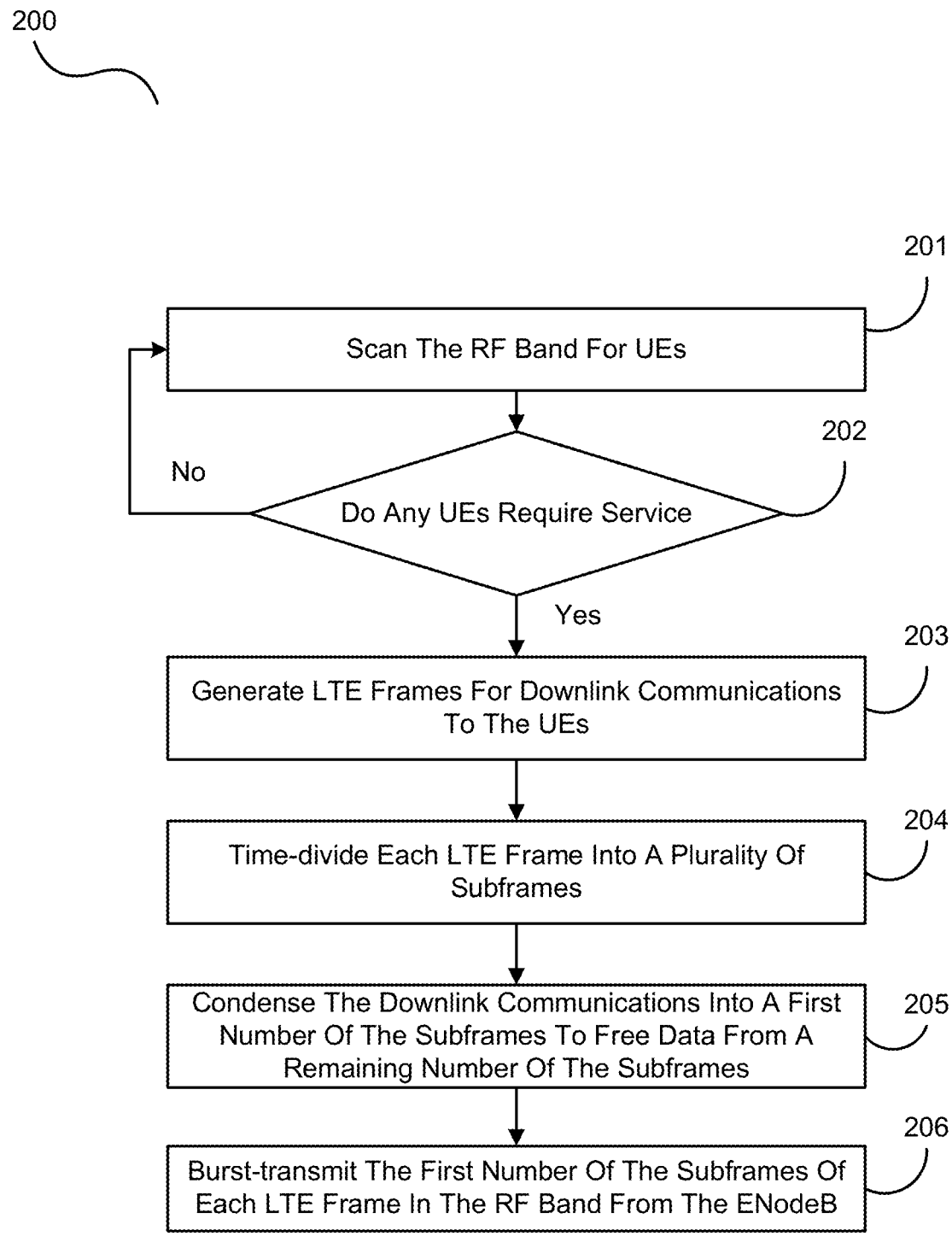
FIG. 2 is a flowchart illustrating an exemplary process of the LTE wireless telecommunication system.
Figures 3A, 3B:
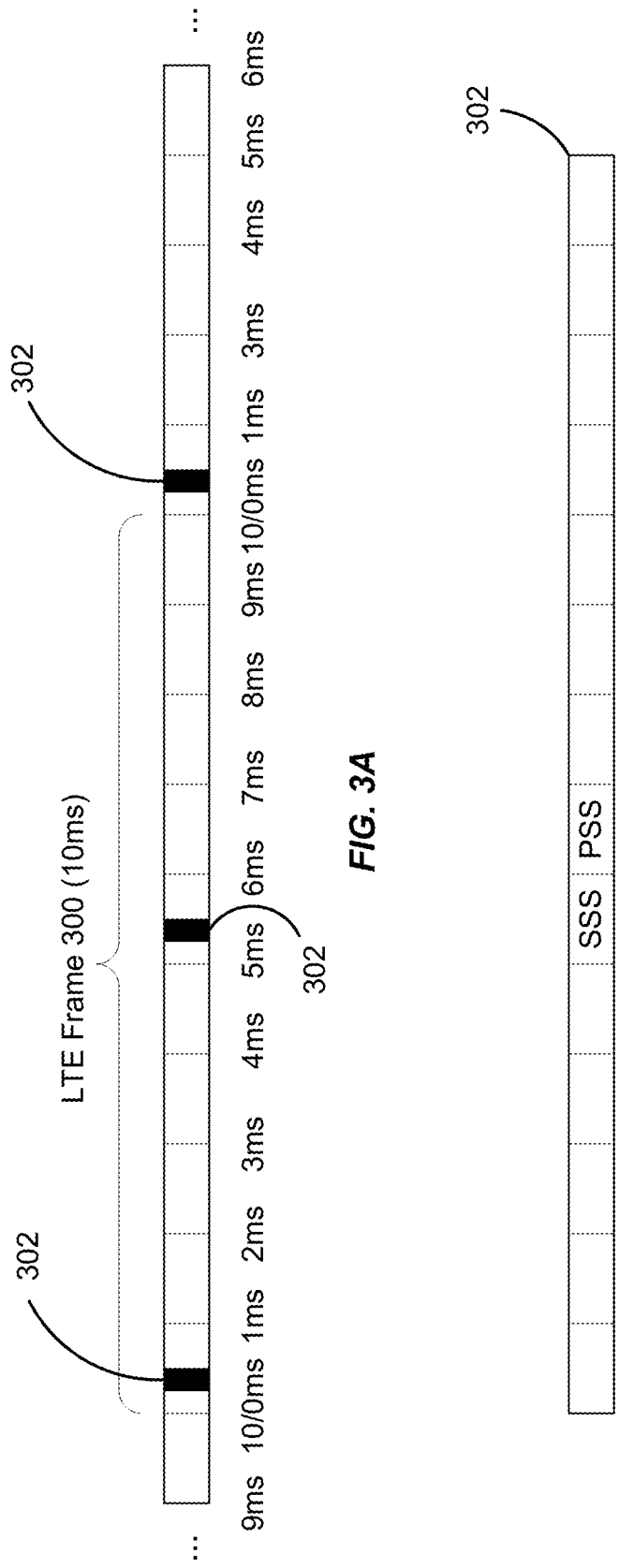
FIGS. 3A and 3B are block diagrams of an exemplary LTE frame comprising two synchronization signals.

FIG. 2 is a flowchart illustrating an exemplary process 200 of the LTE wireless telecommunication system 100 of FIG. 1. As mentioned, the RF band in which the LTE system 100 operates may include other wireless communication systems, such as WiFi networks that could potentially conflict with the communications of the LTE system 100, and vice versa. In this embodiment, an eNodeB 101 of the LTE system 100 scans the RF band for UEs 102, in the process element 201, to determine if any UEs 102 requiring service are within the range of the eNodeB 101, in the process element 202.

If the eNodeB 101 has a subscriber UE 102 "connected", the eNodeB 101 generates LTE frames to support downlink communications to the UEs 102, in the process element 203. Previously, the LTE frames, when connected to a subscribing UE 102, were continuously transmitted from the eNodeB 101. This type of transmission could interfere with the other wireless communication systems operating in the same RF band. In accordance with the inventive aspects hereof, the eNodeB 101 time-divides each LTE frame into a plurality of subframes, in the process element 204, and then condenses the downlink communications into a first number of subframes to free data from a remaining number of subframes, in the process element 205. For example, a downlink LTE frame may be capable of supporting 72 subscriber UEs 102. However, there may not be that many UEs 102 in range of the eNodeB 101 to support. Accordingly, the vast majority of the downlink LTE frame may go unused. The eNodeB 101 may then move some of the necessary data of LTE communications into a first portion of the LTE frame to occupy one or more subframes of the LTE frame such that the remaining portion of the LTE frame is empty. And, as the remaining portion of the LTE frame is empty, the eNodeB 101 can then burst transmit the first number of the subframes of each LTE frame, in the process element 206, so as to free up a portion of the RF band.

In other words, since the data required to support the in-range UEs 102 has been condensed into a first portion of each LTE frame transmitted, a portion of the LTE frame is no longer needed. Accordingly, the eNodeB 101 may simply transmit only the subframes of the LTE frame that are needed. And, as the LTE frame no longer occupies the entirety the RF band it is operating in, other competing/conflicting wireless systems, such as WiFi systems, can transmit during the off time in each LTE frame.

It should be noted that the invention is not intended be limited to any particular number of transmitted subframes in the LTE frame. Instead, the number of transmitted subframes, and thus the time between subframe transmissions, may change periodically. For example, if no subscribers UEs 102 are present at an eNodeB 101, the eNodeB 101 may configure the LTE frame to transmit some minimal number of subframes required to ensure that the frequency band is maintained. Then, as subscriber UEs 102 come within range of the eNodeB 101 and require service, the eNodeB 101 may increase the number of subframes transmitted during the LTE frame. This LTE frame configuration may be performed by the eNodeB 101 itself or as directed by another element in the LTE system 100 (e.g., the LTE network processing element 110).

The embodiments herein apply to multiple forms of LTE communications. For example, even when no data traffic of UEs 102 exists on the air interface of the eNodeB 101, LTE communications periodically transmit a variety of control and reference Signals. However, in low mobility scenarios, control and reference signals can be reduced because there are fewer UEs 102 to support. This is particularly applicable to LTE hot spot/small cell deployments, where the UEs 102 are more likely to be stationary or moving at slower speeds (e.g., pedestrian speeds). The embodiments herein can be used to reduce the periodicity of certain LTE control and reference signals, thereby providing a time gap in the absence of LTE data traffic and providing opportunities for other wireless services.

In one embodiment, the eNodeB 101 introduces a frame structure message option on the first symbol of the first sub-frame containing a format to be used in the LTE frame. This format may incorporate information pertaining to the location of the PSS/SSS, physical broadcast channel messages, and the empty/non-transmitted subframes. The frame structure message may also be used to define alternate frame structures with lower periodicity PSS/SSS lower periodicity physical broadcast channels, and lower density reference signal patterns for more benign environments where a lower number of reference signals are needed.

Examples of LTE frames where the inventive concepts herein may be employed are illustrated in FIGS. 3, 4, 6, and 7. In FIGS. 3A and 3B, an LTE frame 300 comprises two synchronization signals, the PSS and the SSS, transmitted in the six mid frequency RBs and are separated every five subframes, or 5 ms (302). Again, the PSS and SSS enable the UE 102 to obtain timeslot frame synchronization with a particular eNodeB 101.

Assuming that an area of the UE 102 is under the coverage of a macro cell and/or a small cell, then the periodicity of the PSS and SSS can be increased from 5 ms to 10 ms or 20 ms. The flexibility to increase the periodicity of the PSS and the SSS may employ additional frame structure options to assist the UE 102 with synchronization during longer periods of transmission. For example, a stable local oscillator and improved phase lock-loop circuitry could be used for the longer periods to reduce the number of synchronization signals needed for UE 102 synchronization in the LTE system 100.

Alternatively or additionally, the UE 102 can maintain synchronization by utilizing a synchronization signal from a macro cell by calculating a time of arrival difference between a synchronization signal from a small cell and the macro cell. From there, the UE 102 could use the macro cell's synchronization signal with the time of arrival difference to maintain synchronization while the smaller cell's synchronization signals are suppressed. The UE 102 could also tune its synchronization when the synchronization signals of the smaller cell are active.

In another example, MIBs and SIBs are traditionally sent periodically to provide a UE 102 with basic system information such as bandwidth, control channel configuration, etc. Typically, the MIB is sent at the six middle RBs every frame, or every 1 millisecond. And the "SIB 1" is repeated every eight frames, or every 8 ms, while other SIBs are scheduled periodically. In accordance with the inventive aspects hereof, the periodicity of MIB can be increased from 1 millisecond to 10 ms or even 20 ms with little to no interruption to the UE 102.

Figure 4:
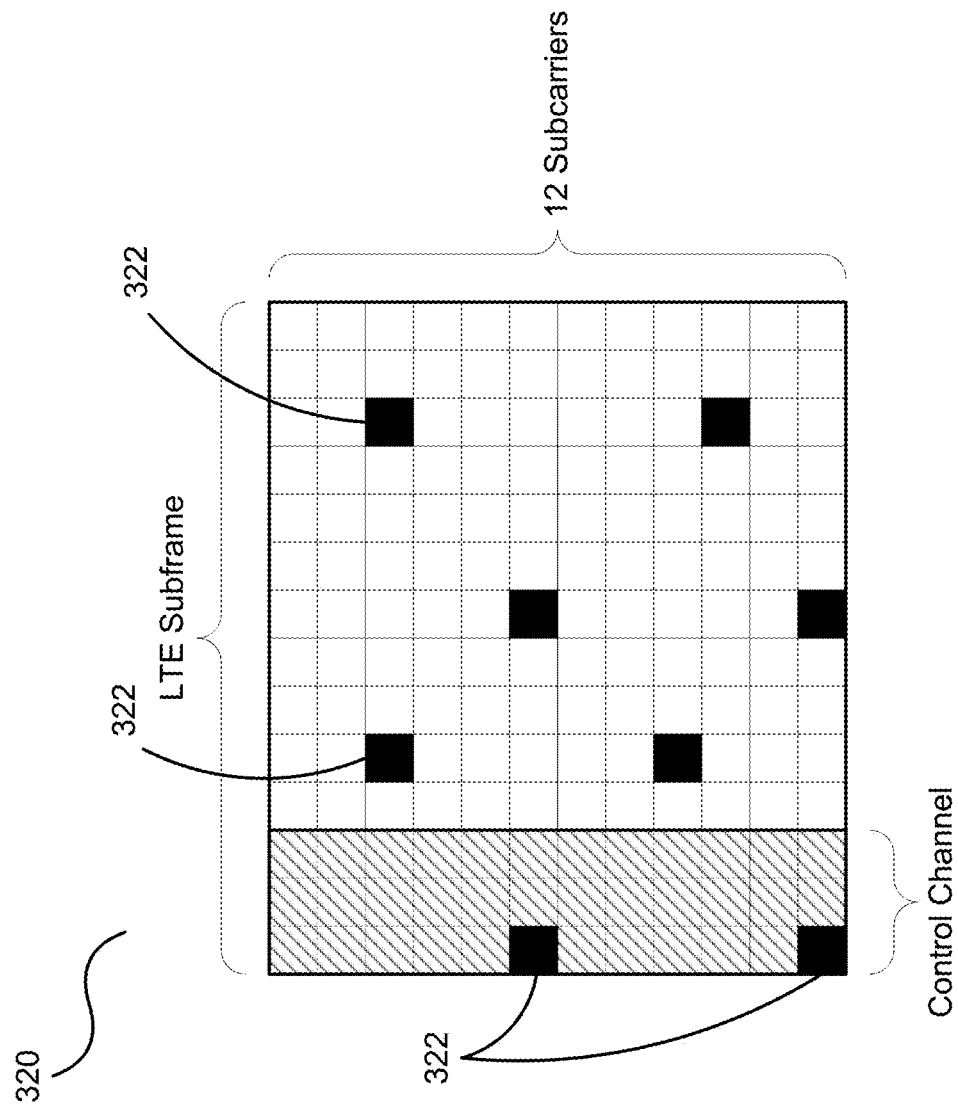
FIGS. 4-7 are block diagrams illustrating exemplary configurations of the LTE frames.

In FIG. 4, an exemplary LTE subframe 320 is illustrated to show that certain reference signals can be moved about within the LTE frame when there are fewer subscriber UEs 102. Cell-Specific Reference Signals (CSRSs) 322 are sent throughout the LTE downlink grid of LTE frames, in both time and frequency, in each subframe of each LTE frame. The CSRSs 322 are used for channel estimation for coherent detection by the UEs 102. The CSRSs 322 are transmitted regardless of the presence of downlink data traffic. Other reference signals are UE specific and are only sent on the resource blocks scheduled for particular UE 102. In certain scenarios, where time and frequency synchronization requirements are not highly stringent, subframes can be configured with lower density reference signal patterns (e.g., in low noise environments, low mobility environments, etc.). And, in some instances, the CSRSs 322 can be eliminated entirely such that a single UE specific reference signal is sent. In other words, the UE specific reference signals would only be sent during an active downlink transmission targeted toward a particular UE, thereby freeing up time for transmission by another wireless system at a particular frequency.

Figure 5:
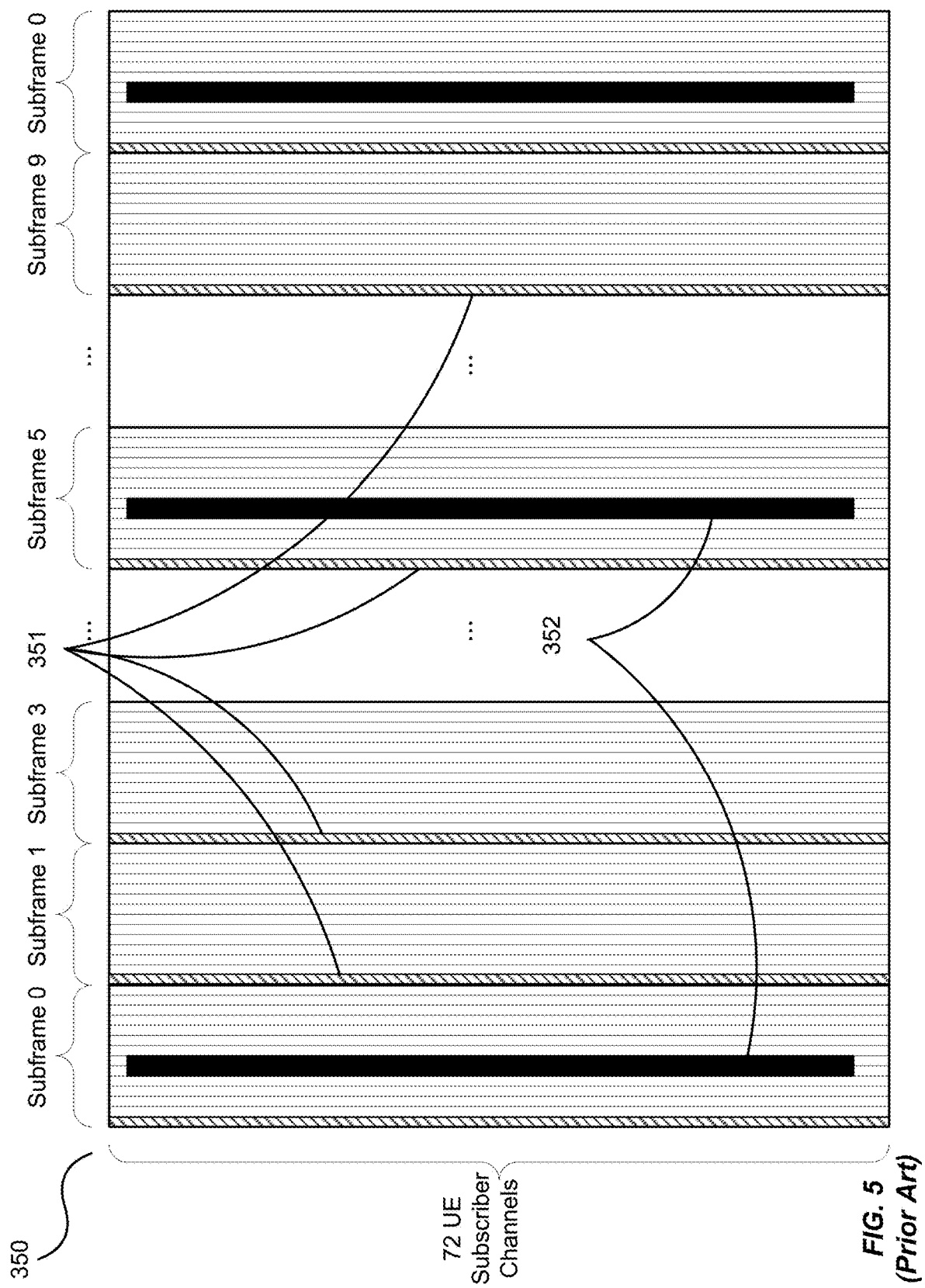
Figure 6:
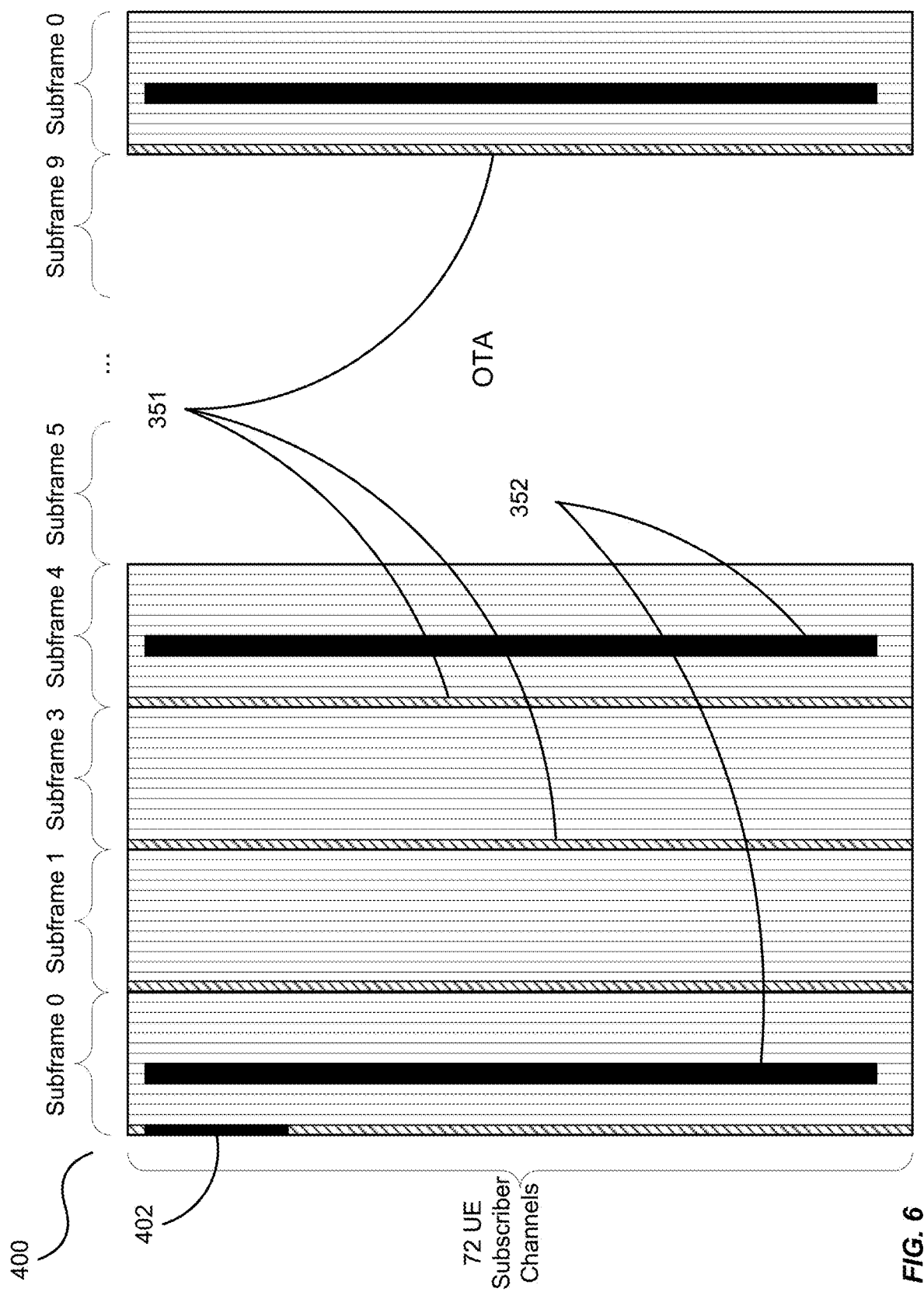
Figure 7:
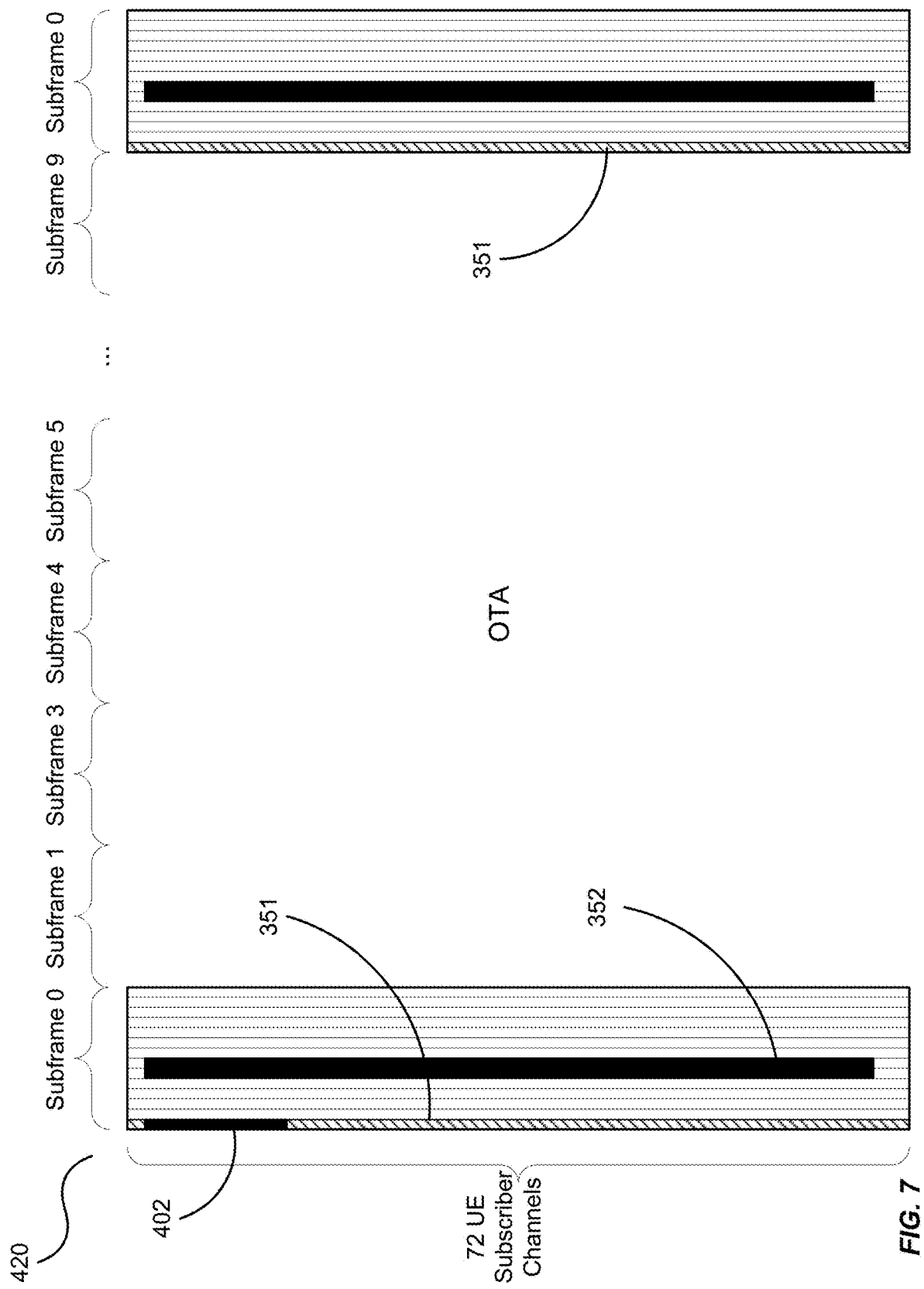

In FIGS. 5-7, LTE frames are illustrated to show how they might be reconfigured in accordance with the inventive aspects herein. In FIG. 5, a traditional LTE frame 350 is illustrated having 72 UE 102 subscriber channels with 10 subframes in each LTE frame (labeled subframes 0-9 with each subframe being 1 ms in duration for a total of 10 ms). As noted previously, the LTE frame 350, when traditionally configured, occupies the RF band even when there is no data transmit and maintains its synchronization by transmitting a synchronization message every 5 ms (e.g., synchronization message 352 in the subframes 0 and 5).

A control channel 351 is transmitted with each subframe of an LTE frame. By incorporating a frame structure message 402 in the control channel 351, as illustrated in LTE frame 400 in FIG. 6, UEs 102 can determine the characteristics of the frame 400. For example, given certain levels of clock stability and other synchronization capabilities, it is possible to transmit to LTE frames without synchronization signals. By configuring the frame structure message 402 in the control channel 402 of a subframe, a UE 102 can determine how the LTE frame 400 is configured without the use of the synchronization signals. Thus, the synchronization signals of subframes 0 and 5 can be eliminated. And, since the subframes are no longer needed for synchronization, they can be removed during periods of low usage resulting in a burst transmissions of necessary subframes (e.g., subframes 0-4) to support UE 102 communications.

Alternatively or additionally, synchronization signals 352 can be moved into other subframes, exemplarily illustrated in FIG. 6 with the subframe 4. In this regard, the frame structure message 402 can indicate to the UE 102 how the synchronization signals are configured such that synchronization can be performed. As a further example, in FIG. 7, the LTE frame 420 as illustrated as having very few data requirements. For example, the eNodeB 101 may have very few or no UEs 102 within its range and as such doesn't need to transmit data that much data. And in the case of zero UEs 102, synchronization of the LTE frame would be simply for the purposes of the eNodeB 101. Accordingly, the synchronization signal is largely unneeded and as such is implemented with a single subframe allowing multiple subframes to be removed from the LTE frame. And, as exemplarily illustrated in FIG. 7, only a single subframe 0 needs to be transmitted, leaving a considerable amount of time for other wireless systems to communicate.

Again, the invention is not intended to be limited to any particular number of subframes. Rather, the number of subframes can change dynamically with the number of UEs 102 requiring service from an eNodeB 101. Alternatively or additionally, the LTE frames may be statically configured with a predetermined number of subframes, for example, when data requirements are known. In addition to the advantages of allowing other competing wireless systems time for communications, the embodiments herein may provide the advantages of reduced energy requirements. For example, since the eNodeB 101 is no longer required to continuously transmit even during periods of relative inactivity, the burst transmissions of the subframes reduce the energy requirements for signal transmission.

Figure 8:
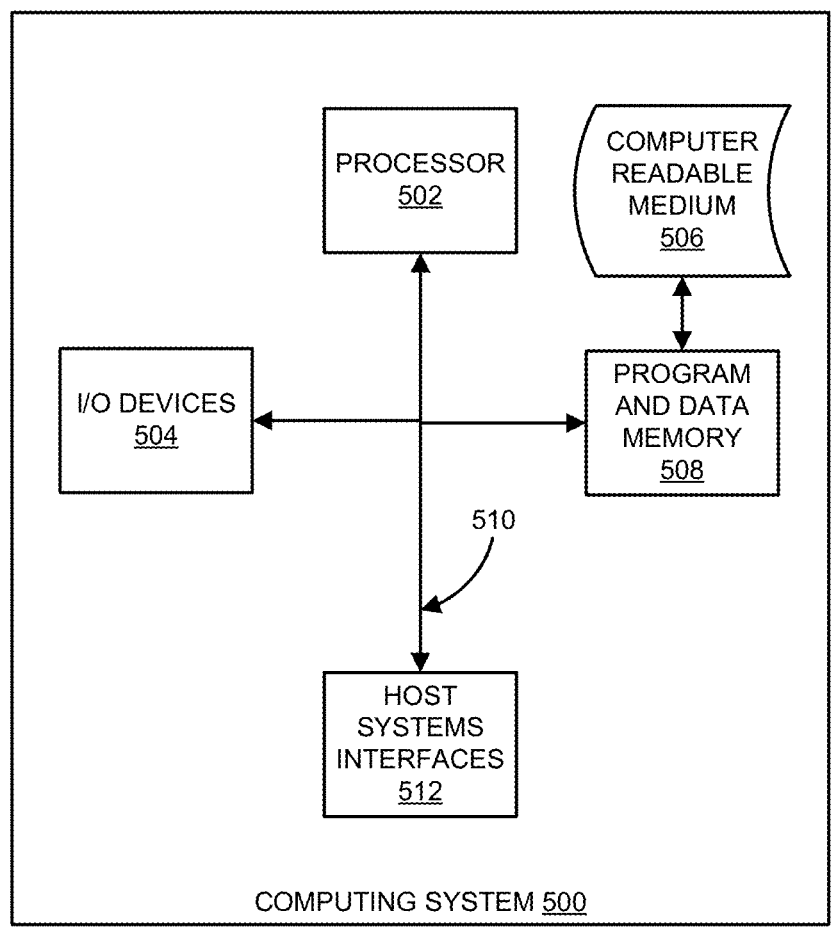
FIG. 8 is a block diagram of an exemplary computing system in which a computer readable medium provides instructions for performing methods herein.

The invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 8 illustrates a computing system 500 in which a computer readable medium 506 may provide instructions for performing any of the methods disclosed herein.

Furthermore, the invention can take the form of a computer program product accessible from the computer readable medium 506 providing program code for use by or in connection with a computer or any instruction execution system. For the purposes of this description, the computer readable medium 506 can be any apparatus that can tangibly store the program for use by or in connection with the instruction execution system, apparatus, or device, including the computer system 500.

The medium 506 can be any tangible electronic, magnetic, optical, electromagnetic, infrared, or semiconductor system (or apparatus or device). Examples of a computer readable medium 506 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 500, suitable for storing and/or executing program code, can include one or more processors 502 coupled directly or indirectly to memory 508 through a system bus 510. The memory 508 can include local memory employed during actual execution of the program code, bulk storage, and cache memories which provide temporary storage of at least some program code in order to reduce the number of times code is retrieved from bulk storage during execution. Input/output or I/O devices 504 (including but not limited to keyboards, displays, pointing devices, etc.) can be coupled to the system either directly or through intervening I/O controllers. Network adapters may also be coupled to the system to enable the computing system 500 to become coupled to other data processing systems, such as through host systems interfaces 512, or remote printers or storage devices through intervening private or public networks. Modems, cable modem and Ethernet cards are just a few of the currently available types of network adapters.

What is claimed is:

1. A method for increasing radio frequency spectrum efficiency in a wireless communication system, comprising:
   generating first frames for wirelessly transmitting data from a first base station of the wireless communication system to user equipment devices; and
   completely discontinuing transmission of Cell-Specific Reference Signals in the first frames to increase radio frequency spectrum efficiency, while transmitting user equipment (UE)-specific reference signals, in response to a reduction in a number of user equipment devices being served by the first base station.

2. The method of claim 1, further comprising including a frame structure message with one or more sub-frames of the first frames, wherein the frame structure message indicates a location of one or more control signals in at least the first frames.

3. The method of claim 2, wherein the one or more control signals include one or more synchronization signals.

4. The method of claim 2, wherein the frame structure message further indicates a location of at least one of empty subframes and non-transmitted subframes, in at least the first frames.

5. The method of claim 1, further comprising:
   at a first one of the of user equipment devices, calculating a time of arrival difference between a first synchronization signal received from the first base station and a second synchronization signal received from a second base station; and
   at the first one of the of user equipment devices, using the time of arrival difference to maintain synchronization while synchronization signals from the first base station are suppressed.

6. The method of claim 5, wherein the first base station comprises a small cell, and the second base station comprises a macro cell.

* * * * *